(12) United States Patent
Pedersen et al.

(10) Patent No.: US 12,418,755 B2
(45) Date of Patent: Sep. 16, 2025

(54) HEARING AID AND METHOD OF PERFORMING BIT ERROR CONCEALMENT

(71) Applicant: Oticon A/S, Smørum (DK)

(72) Inventors: Mark Ruvald Pedersen, Smørum (DK); Nels Hede Rohde, Smørum (DK); Rene Poulsen, Smørum (DK); Søren Vørnle Nielsen, Smørum (DK); David Thorn Blix, Smørum (DK)

(73) Assignee: Oticon A/S, Smørum (DK)

( * ) Notice: Subject to any disclaimer, the term of this patent is extended or adjusted under 35 U.S.C. 154(b) by 232 days.

(21) Appl. No.: 18/361,936

(22) Filed: Jul. 31, 2023

(65) Prior Publication Data

US 2024/0048919 A1 Feb. 8, 2024

(30) Foreign Application Priority Data

Aug. 5, 2022 (EP) .................................. 22189010

(51) Int. Cl.
*H04R 25/00* (2006.01)

(52) U.S. Cl.
CPC ......... *H04R 25/505* (2013.01); *H04R 25/558* (2013.01); *H04R 2225/43* (2013.01)

(58) Field of Classification Search
CPC ................ H04R 25/505; H04R 25/558; H04R 2225/43; H04R 25/554; H04R 25/50; G10L 21/0364; G10L 25/51; G10L 19/005; H03M 13/09; H04L 1/201
See application file for complete search history.

(56) References Cited

U.S. PATENT DOCUMENTS 5,799,039 A  8/1998  Laird et al.

FOREIGN PATENT DOCUMENTS

WO    WO 01/93488    12/2001

*Primary Examiner* — Tuan D Nguyen (57) ABSTRACT

A method, at a hearing aid, including receiving a wireless signal including a succession of frames including a first frame including first encoded audio samples and determining a first codec, performing an error check based on the first frame, and in accordance with a determination that the first frame fails to pass the error check, performing a test.

17 Claims, 6 Drawing Sheets

HEARING AID AND METHOD OF PERFORMING BIT ERROR CONCEALMENT

The present disclosure relates to a hearing aid with a wireless communications unit for short-range wireless communication of audio data using e.g., Bluetooth Low Energy communication.

BACKGROUND

Some hearing aids comprise a radio unit for receiving a wireless audio signal which is rendered by an output unit of such a hearing aid for a user to listen to the audio signal. The wireless audio signal is transmitted from a remote electronic device, e.g., a smartphone, a television, an external microphone device, a so-called TV box etc, and may be rendered by the output unit and/or mixed with a signal picked up by means of one or more microphones at the hearing aid before being rendered by the output unit. The hearing aid performs compensation for a hearing loss, e.g., based on a hearing aid prescription. A prominent use-case is streaming of audio from a smartphone to the hearing aid or (binaural) hearing aids e.g., during a phone-call or while listening to music.

Hearing aids have a small size (form factor) and sits during normal use at a user's one ear or in case of binaural hearing aids at both ears e.g., behind a user's ear and/or in the user's ear canal e.g., entirely in the ear canal. Only a very limited battery power budget is available to keep the hearing aid(s) operating throughout a full day. For these and other reasons, hearing aids have limited processing power. Further, an antenna coupled to the radio unit or forming part of the radio unit is arranged to fit the small form factor. This poses technical challenges at least when it comes to reception of a wireless audio signal from a remote electronic device. The hearing aid(s) often do not have a direct line of sight to the transmitter, e.g., a smartphone which may reside in a pocket, this may degrade the signal-to-noise ratio of the received wireless signal, which in turn may induce bit-errors in the audio data. Further, and due to the limited processing power, forward error-correcting codes (FEC) or other error-correcting mechanisms are generally not technically viable for implementation in a hearing aid.

For short-range wireless communication of audio data using e.g., Bluetooth Low Energy communications, audio data are transmitted in packets of data e.g., during a so-called connection event. Each packet of data may comprise one or more audio frames or an audio frame may be communicated by one or more packets of data.

The wireless communications unit may perform an error-check and return an acknowledge (ACK) message to communicate an error-free reception of a packet of data of an audio frame if the block or audio frame passed the error-check. If the block or audio frame did not pass the error-check, the wireless communications unit may return a negative-acknowledge (NACK) to the transmitter to thereby request a retransmission of the packet or audio frame. This may provide a second chance to receive the packet or audio frame.

However, if the packet or audio frame and any retransmission fail to pass the error-check, the audio frame is lost and may easily cause an audible artefact. At least in some examples, an audio frame corresponds to 5-20 milliseconds of audio, e.g., 7.5 or 15 milliseconds of audio, e.g., less than 100 milliseconds.

At least for some hearing aids, and due to the e.g., limited processing power and battery power budget, error-corrective mechanisms are not viable or possible by protocol specification. Instead, the hearing aid may be configured to perform Packet Loss Concealment to perceptually mask the lost audio frames of incoming real time audio data stream. Thus, Packet Loss Concealment compensates for lost or rejected audio frames and attempts at reducing audible artefacts associated with a loss or rejection of an audio frame.

At least for the above reasons, there is a need for improved processing, at a hearing aid, of audio frames received via a wireless communications unit.

PRIOR ART

Packet Loss Concealment compensates for the loss or rejection of audio frames and attempts at reducing audible artefacts associated with a loss or rejection of a full audio frame.

Forward error-correcting codes (FEC) are generally not technically viable for implementation in a hearing aid at least due to only limited processing power at a hearing aid.

Generally, error checks, e.g., cyclic redundancy checks, are power-efficient to perform. On the contrary, error-correcting mechanisms are too expensive to perform in a hearing aid.

SUMMARY

There is provided:
A method, comprising:
at a hearing aid with a processor; a memory; an output unit; and a wireless communication unit:
   receiving, via the wireless communication unit, a wireless signal including a succession of frames including a first frame including first encoded audio samples; and determining a first codec;
   performing an error check based on the first frame; and in accordance with a determination that the first frame fails to pass the error check:
      performing a test, including determining first difference values between first expected histogram values in categories and first observed histogram values of the first encoded audio samples in the categories; wherein the expected histogram values are associated with the first codec; and determining a first fitness value associated with the first difference values; wherein the first expected histogram values are stored in the memory;
      in accordance with a determination that the first fitness value satisfies a first criterion, enabling rendering of the first encoded audio samples via the output unit.

One technical effect is that the method provides a graceful degradation in terms of audio quality in response to bit-errors in the first frame e.g., in connection with streaming of the succession of frames to the hearing aid. Rather than disregarding an entire first frame, the first frame may proceed to rendering as an audio signal when the frame has only a tolerable amount of bit-errors.

Another technical effect is that rendering of the first encoded audio samples is enabled despite the first frame failed the error-check however, only in accordance with a determination that the first fitness value satisfies the first criterion.

If, e.g., the first fitness value indicates a poor fit between the expected histogram values and the observed histogram values, the method may forgo enabling rendering the first encoded audio samples. In that case there may be too many bit-errors in the first encoded audio samples to provide a reasonable audio quality by rendering of the first encoded audio samples via the output unit. On the contrary, if, e.g., the first fitness value indicates a relatively good fit between the expected histogram values and the observed histogram values, the method may enable rendering of the first encoded audio samples with an acceptable quality. It may prove acceptable to render a frame containing an acceptable number of bit-errors e.g., less than 10 sample values out of a frame containing 120 sample values.

The histogram values, including one or both of the expected histogram values and the observed histogram values, may be represented e.g., as a count (integer) value, a frequency value (counts per unit of time), or as a probability density value, e.g., a multibit value between 0.1 and 1.0 or between 0.0 and 100.0. The histogram values may be e.g., normalized to sum to a fixed value e.g., sum to 1.0. Thus, the histogram values can be represented in different ways as it is known in the art.

The error check may be a binary error check resulting in either a pass or a fail (fail to pass) of the first frame. The error check may be based on e.g., a cyclic redundancy check (CRC).

In some aspects, the first difference values between the first expected histogram values and the first observed histogram values are 1-norms ($|x|$) or 2-norms ($x^2$). When the first difference values are 2-norms, they may be denoted divergence values.

In some aspects, the first fitness value is an estimated statistical probability that the observed histogram values associated with a first probability density distribution are randomly drawn from a second probability density distribution associated with the expected histogram values. The first fitness value may also be denoted a P-value. In some aspects, the first fitness value is a cumulative test statistic e.g., a chi-squared test statistic.

In some aspects, the first fitness value is proportional to, e.g., equal to a sum of the first difference values across the categories or equal to a sum of first divergence values across the categories.

In some aspects, the first fitness value is an estimated value of the number of bit errors in the first frame. Alternatively, the method includes converting the first fitness value to an estimated value of the number of bit errors in the first frame.

In some aspects, the encoded audio samples or coded audio samples has a first bit depth. The bit depth may be e.g., 12 bits, 16 bits or more bits or fewer bits. In some aspects, the categories collectively spans the full dynamic range of a bit depth of the audio samples. In some examples, there is a category for each audio sample value. E.g., for a bit depth of 16 bits there are 65,536 categories ($2^{16}$=65,536). In some examples, a category spans more the one sample value. In some examples a frame contains 60 or 120 coded audio sample values or e.g., less than 200 sample values.

In some aspects, the first criterion includes a first threshold value. The first criterion may be that the fitness value exceeds the first threshold value. The second criterion may be that the fitness value is lower than or equal to the threshold value. In some aspects, the second criterion includes a second threshold value, different from the first threshold value.

In some aspects, rendering of the first encoded audio samples via the output unit inherently includes enabling rendering of the first encoded audio samples via the output unit.

Enabling rendering of the first encoded audio samples via the output unit may comprise one or more of: writing the first frame to a memory area, enabling a signal processing stage reading the first frame from the memory area, and passing the first frame on to a signal processing stage. Other ways of enabling rendering of the first encoded audio samples of the first frame via the output unit can be used.

Conversely, forgoing enabling rendering of the first encoded audio samples of the first frame via the output unit may comprise one or more of: forgoing writing the first frame to a memory area, clearing the first data frame from the memory area, disabling reading of the first data frame, forgoing passing the first data frame to a signal processing stage and overwriting the memory area storing the first data frame. Other ways of forging enabling rendering of the first encoded audio samples of the first frame via the output unit can be used.

The first encoded audio samples are provided in a codec domain. Thus, the first audio frame carries encoded audio samples in the codec domain. The codec may be a so-called Adaptive Differential Pulse Code Modulation (ADPCM) codec. Examples of codecs are G.711 604, G.726 606, G.722 608, G.722.1 610, and AAC ELD. Other codecs are also possible.

The first encoded audio samples are e.g., encoded at a transmitter which is wirelessly connected to the receiver by means of a first wireless protocol. The first wireless protocol may be, e.g., a Bluetooth, such as a Bluetooth Low Energy (BLE, LE), protocol or another wireless protocol for short-range wireless communication. The protocol may enable that the transmitter and receiver can negotiate agreement on using the first codec, which may be a codec selected from a group of codecs. Such protocols and such negotiations are known in the art.

The expected histogram values may resemble a histogram of values output from an encoder in accordance with the codec e.g., when the encoder encodes an audio signal containing tones, music, speech, white noise, coloured noise or a combination thereof. The expected histogram values may approximate a codec output distribution. The expected histogram values may be obtained by performing simulations based on obtaining a histogram of second samples, wherein an amount of second samples is e.g., much larger than the amount of samples in the first frame.

The output unit may include one or more loudspeakers and/or an amplifier and or a transmitter communicating with a loudspeaker.

In some aspects, the hearing aid comprises an input unit configured to convert an acoustic signal, e.g., from the surroundings of the user of the hearing aid, to an input signal. The input unit may include one or more microphones e.g., comprising a beamformer. The input unit may also include an in-the-ear microphone.

In some aspects, the method is performed at a first hearing aid and at a second hearing aid, wherein both hearing aids comprises a processor; a memory; an output unit; and a wireless communication unit. An advantage is that the risk of the user perceiving a phase-changing perspective or an alternating sideways shifting sound perspective is reduced. It has been observed that the method reduces such a risk compared to error-checks and packet loss concealment only.

The first hearing aid and the second hearing aid may collectively form a binaural hearing aid system.

In some embodiments, the method comprises:
  in accordance with a determination that the first frame passes the error check:
    forgoing performing the test based on the first frame, and enabling rendering the first encoded audio samples via the output unit.

An advantageous technical effect is a more robust method and improved audio quality. One reason is that a frame which did pass the first error check is not, e.g., erroneously, rejected based on the test. Whereas the error check is well-suited to discriminate frames without errors from frames containing one or more errors in a binary decision, the test is better suited at quantifying the amount of error in a frame however with some uncertainty. The uncertainty may be due to the statistical character of the expected frequency values, e.g., in the form of a histogram. The test can be forgone, and the uncertainty of the test at risk of rejecting the frame or exposing the frame to transient noise reduction can be circumvented, by forgoing performing the test in accordance with a determination that the first frame passes the error check. It is an advantage that battery power can be saved.

Thus, the test need not be, and expediently, is not performed if frames pass the error-check. In response to a frame failing to pass the error-check, the test is performed at least on that frame.

In some embodiments, the method comprises:
in accordance with a determination that the first fitness value fails to satisfy the first criterion, or in accordance with a determination that the first fitness value satisfies a second criterion, different from the first criterion:
forgoing enabling rendering the first encoded audio samples via the output unit.

An advantage is that rendering of the first encoded audio samples can be dispensed with if the first fitness value is e.g., indicative of an amount of bit errors above a threshold.

The second criterion may be complementary to the first criterion. In some examples the first criterion may be that the fitness value must fall in a first range. The second criterion may be that the fitness value must fall in a second range, wherein the second range is non-overlapping with the first range.

In examples wherein the fitness value is a probability estimate, as examples, the first range may be above 70% or above 60% e.g., 70 to 100% or 60 to 100%. The second range may be below 70% or below 60%. This may correspond to less than 40 about 40 bit-errors per 120 coded samples. Here, the ranges are defined in terms of probabilities in percentages, but they may equally well be defined in terms of values between 0.0 and 1.0.

In examples wherein the fitness value is an accumulated difference or divergence, the ranges may be set correspondingly.

In some embodiments the method comprises:
in accordance with a determination that the first fitness value fails to satisfy the first criterion, or in accordance with a determination that the first fitness value satisfies a second criterion, different from the first criterion:
forgoing enabling rendering the first encoded audio samples via the output unit; and
performing packet loss concealment.

An advantage is that rendering of the first encoded audio samples can be replaced by packet loss concealment if the first frame contains an amount of bit errors above a threshold. The method may thus fall back to performing packet loss concealment if it is determined, e.g., statistically, that the first frame contains too many bit errors. The actual amount of bit errors may not be known, but instead be estimated by the first fitness value or at least be associated with the first fitness value.

Packet loss concealment is an activity that provides rendering of audio despite missing or having discarded an entire frame of audio samples. Packet loss concealment may include e.g., repeating a previously rendered frame or introducing a synthetically generated frame of audio samples e.g., to reduce a severity of (audible) artefacts caused by the loss of an entire frame. Packet loss concealment aims to mask the loss of an entire frame of audio samples.

In some embodiments the method comprises:
determining the first codec from a set of codecs by codec negotiation between the wireless communication unit and a remote electronic device in communication with wireless communication unit; and
retrieving the first expected histogram values from a memory; wherein the first expected histogram values are associated with the first codec.

An advantage is that the method can improve accuracy of bit-error estimation e.g., when selection of codec is not fixed in advance of the negotiation. Conventionally, e.g., in Bluetooth LE audio communication, the wireless communication unit performs codec negotiation with the remote electronic device to agree on an audio codec among a set of available audio codecs at the hearing aid.

As mentioned, in some examples the wireless communication takes place using Bluetooth Low Energy audio communication. The wireless communication unit may be responsible for setting up and tearing down a connection between two devices. It may also be responsible for negotiating what codec to use considering the capabilities of the two devices.

The memory stores expected frequency values for at least some, e.g., each, available audio codec. In some aspects, the method comprises: in accordance with a determination that expected frequency values are not available for an agreed codec: forgoing performing the test. Conversely, in accordance with a determination that expected frequency values are available for an agreed codec: performing the error check on the first frame; and in accordance with a determination that the first frame fails to pass the error check: performing the test.

Thereby, the method can fall back to normal error-checking and packet loss concealment if data supporting the test are not available.

Adaptive Delta Pulse Code Modulation (ADPCM) codecs. Only one example of a family of codecs. Codecs without an audio frame header.

In some embodiments the method comprises:
in accordance with a determination that the first fitness value satisfies the first criterion:
decoding, in accordance with the first codec, the first encoded audio samples into coded audio samples.

The coded audio samples are digital audio samples that are coded by a convention e.g., including organization of bits etc. The coded audio samples may thus simply be digital sample values. The coded audio samples may be acceptable by a signal processor e.g., comprising one or more filters and/or a digital-to-analogue converter. In some examples, the first encoded audio samples are in accordance with pulse code modulation (PCM).

In some aspects, the method comprises: in accordance with a determination that the first fitness value falls in the first range of values, buffering the coded audio samples. Buffering may include storing values in a codec domain or storing values in a non-codec domain. The codec domain may be defined to extend between encoding and decoding in accordance with the codec.

In some embodiments the method comprises:
in accordance with a determination that the first fitness value satisfies the first criterion:
performing first noise reduction on the coded audio samples.

An advantage is that filtering can be applied to remove unpleasant transients in accordance with the first fitness value falling in the first range of values. The first fitness value may be associated with, such as proportional or squarely proportional to, the number of errors in the value of the audio samples. E.g., in case of a smaller number of errors in the value of the audio samples, the audio samples are filtered to remove transients before the coded audio samples are reproduced via the output unit. This may be a much better trade-off than discarding entire frames which did not pass the error check. In some aspects, the noise reduction is transient noise reduction.

Frames which did not pass the error check are not simply rejected, rather a test is performed, which may enable rendering of the first frame as an audio signal despite, e.g., minor, amounts of errors, which caused the first frame to not pass the error check. Such, e.g., minor, amounts of errors may be considered tolerable when softened by subsequent noise reduction such as transient noise reduction, e.g., by filtering.

In some aspects the noise reduction is controlled in response to the first fitness value to provide progressively more smoothing for increasing values of the first fitness value.

In some aspects, the noise reduction and/or lowpass filtering is performed in a time-domain or in a short-time-frequency-domain. In some aspects the first encoded audio samples are time-domain samples. In some aspects the first encoded audio samples are short-time-frequency-domain samples.

In some embodiments the method comprises:
selecting a first processing option among a set of processing options based on the first fitness value; wherein the set of processing options includes at least the first processing option and a second processing option;
wherein the first processing option includes performing first noise reduction on the first audio frame.

An advantage is that filtering can be adapted to the amount of expected bit-errors. For instance, if fewer bit-errors are expected, transient noise reduction filtering of the first frame can be forgone by the second processing option, whereas if more bit-errors are expected, transient noise reduction filtering can be applied (by the first processing option).

In some aspects, the second processing option includes performing second noise reduction on the first audio frame, wherein the second noise reduction is different from the first noise reduction. In some aspects, the second noise reduction is a more aggressive than the first noise reduction.

In some embodiments the set of processing options includes a third processing option; wherein the third processing option includes performing third noise reduction on the first audio frame; wherein the third noise reduction is different from the first noise reduction.

An advantage is that noise reduction, such as transient noise reduction, can be adapted to an estimated amount of bit-errors e.g., estimated based on the fitness value.

In some embodiments the test is a statistical test, the first fitness value is a probability value; and the first criterion is a confidence interval; and the method comprises:
determining whether the first fitness value is significant or not significant.

In some aspects the statistical test is a chi-squared test or a Pearson's chi-squared test. In some aspects the test is based on the Kullback-Leibler divergence. Other statistical tests are possible.

In some embodiments the expected histogram values are obtained from a histogram of a second number of encoded samples without errors; wherein a first number of encoded samples is the number of samples in the first frame; and wherein the second number of encoded samples is significantly greater than the first number of encoded samples.

The histogram of the second number of samples without errors may be obtained from a simulation wherein audio samples are encoded in accordance with the codec. The histogram of the second number of samples without errors may comprise values that show a non-monotonical and non-Gaussian-shaped distribution of the second number of samples. One reason for the shape of the histogram may be imperfect entropy encoding associated with the codec.

The histogram of the second number of samples without errors may include the expected frequency of the second values (1-dimensional histogram) or the expected frequency of a current second value conditioned on a preceding second value (2-dimensional histogram).

The method may comprise determining whether there is a statistically significant difference between the expected histogram values in categories of values and the observed histogram values of the first encoded audio samples in the categories of values.

The encoded samples are in a codec domain meaning that the encoded samples are obtained by encoding audio samples in accordance with the codec. The audio samples may be composed to comprise audio samples obtained from music, speech, silences, white noise or coloured noise or a combination thereof.

In some embodiments the codec is associated with linear encoding/decoding, comprising:
receiving a second frame, comprised by a first succession of frames, associated with a retransmission of the first frame;
splitting the first frame into a first subframe and a second subframe;
splitting the second frame into a third subframe and a fourth subframe;
determining the first fitness value for the first subframe and determining a second fitness value for the second subframe;
determining the third fitness value for the third subframe and determining a fourth fitness value for the fourth subframe;
recomposing the first frame from two or more of the first subframe; the second subframe, the third subframe and the fourth subframe based on the first fitness value, the second fitness value, the third fitness value and the fourth fitness value.

An advantage is that the chance of providing a recomposed first frame with a lower number of errors than the number of errors, if any, in first frame or in the second frame is increased. E.g., the fitness values may reveal that the first frame probably has more errors in a first half-portion than in a second half-portion and the second frame, conversely, probably has fewer errors in a first half-portion than in a second half-portion. Then, the first frame can be recomposed from the first frame and the second frame and in particular the half-portions having fewer errors than the other half-portions. The property that the codec is associated with linear encoding/decoding ensures that portions of the frames can be rearranged without loss of information. In essence the best subframes are concatenated to provide a recomposed first frame. Here, 'best' is understood to include fewest possible errors. If none of the subframes pass the test, the method may fall back to package loss concealment.

In some embodiments the method comprises:
performing compensation for a prescribed hearing loss based on the first encoded audio samples and one or more hearing loss parameter values before rendering the first encoded audio samples as an audio signal via the output unit; and
reproducing the first frame as an audio signal via the output unit.

Small-sized electronic devices, such as e.g., hearing aids, performing compensation for a prescribed hearing loss have a very low battery power consumption budget to stay operable throughout a full day in use. This, and other aspects, demands that e.g., a wireless receiver operates at a minimum power level which in turn increases the risk of bit errors when receiving the wireless audio signal. At least for this reason, the claimed method proves to be advantageous.

The one or more hearing loss parameter values may include e.g., gain values for one or more frequency bands. The one or more hearing loss parameter values may be determined based on e.g., an audiogram obtained from a hearing loss assessment, typically denoted fitting, involving at the least the user of the hearing aid and, typically, a hearing care professional.

Decoding in accordance with the first codec, the first encoded audio samples into coded audio samples, may precede performing compensation for a prescribed hearing loss. The compensation for a prescribed hearing loss is thus based on the coded audio samples. The decoding may be performed in accordance with a determination that the first fitness value satisfies the first criterion or a second criterion.

Generally, rendering encoded audio samples as an audio signal via the output unit may comprise decoding in accordance with the first codec, the first encoded audio samples into coded audio samples.

In some embodiments the hearing aid comprises an input unit and the method; comprises:
in accordance with a determination that the first fitness value satisfies the first criterion or a second criterion:
decoding, in accordance with the first codec, the first encoded audio samples into first coded audio samples;
receiving, via the input unit, an input signal; wherein the input signal comprises third coded audio samples;
generating an output signal based on processing the first coded audio samples and the second coded audio samples; wherein the output signal comprises third coded audio samples; and
rendering the third coded audio samples via the output unit The processing may comprise mixing the first coded audio samples and the second coded audio samples. In some aspects, the processing may comprise performing compensation for a hearing loss e.g., as described herein.

There is also provided:
A computer-readable storage medium comprising one or more programs for execution by one or more processors of an electronic device with a display and a sensor, the one or more programs including instructions for performing the method set out in the claims.

A computer-readable storage medium may be, for example, a software package, embedded software. The computer-readable storage medium may be stored locally and/or remotely.

There is further provided:
A hearing aid comprising:
a processor; a wireless receiver; one or more microphones; an output unit; and
a memory storing one or more programs, the one or more programs including instructions which, when executed by the processor, cause the electronic device to perform the method set out in the claims.

There is still further provided:
A binaural hearing aid system, comprising a first hearing aid as set out above and a second hearing aid as set out above; wherein each hearing aid performs an error check and a test separately from the other hearing aid.

BRIEF DESCRIPTION OF THE FIGURES

A more detailed description follows below with reference to the drawing, in which.

DETAILED DESCRIPTION

Figure 1:
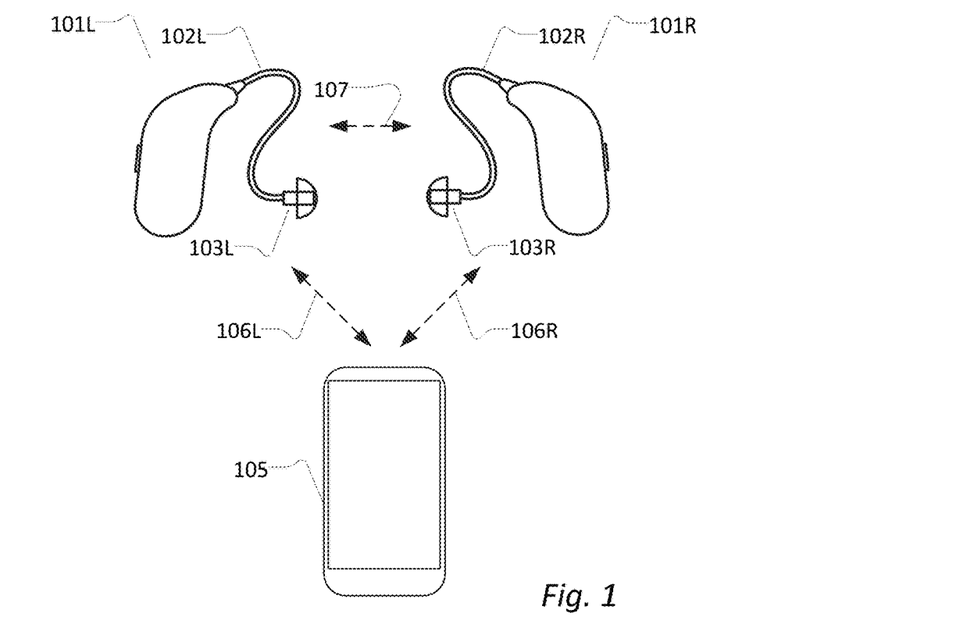
FIG. 1 shows an illustration of hearing aids and an electronic device.

FIG. 1 shows an illustration of hearing aids and an electronic device. The electronic device 105 may be a smartphone or another electronic device capable to short-range wireless communication with the hearing aids 101L and 101R via wireless links 106L and 106R. The electronic device may alternatively be a tablet computer, a laptop computer, a remote wireless microphone, a TV-box interfacing the hearing aids with a television or another electronic device.

The hearing aids 101L and 101R are configured to be worn behind the user's ears and comprises a behind-the-ear part and an in-the-ear part 103L and 103R. The behind-the-ear parts are connected to the in-the-ear parts via connecting members 102L and 102R. However, the hearing aids may be configured in other ways e.g., as completely-in-the-ear hearing aids. In some examples, the electronic device is in communication with only one hearing aid e.g., in situations where the user has a hearing loss requiring a hearing aid at only one ear rather than at both ears. In some examples, the hearing aids 101L and 101R are in communication via another short-range wireless link 107, e.g., an inductive wireless link.

The short-range wireless communication may be in accordance with Bluetooth communication e.g., Bluetooth low energy communication or another type of short-range wireless communication. Bluetooth is a family of wireless communication technologies typically used for short-range communication. The Bluetooth family encompasses 'Classic Bluetooth' as well as 'Bluetooth Low Energy' (sometimes referred to as "BLE").

Figure 2:
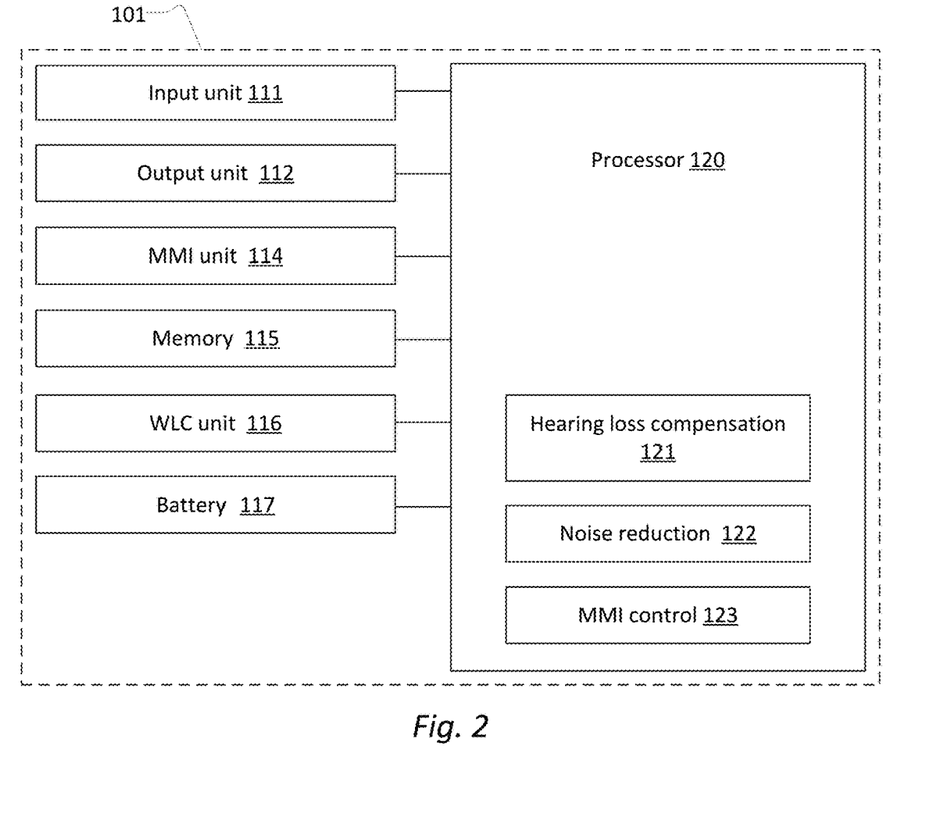
FIG. 2 shows a first block diagram of a hearing aid.

FIG. 2 shows a first block diagram of a hearing aid. The hearing aid 101 comprises an input unit 111, an output unit 112, a man-machine interface unit 114, a memory 115, a wireless communication unit (WLC unit) 116, a battery 117 and a processor 120. The battery may be a single-use battery or a rechargeable battery. The processor 120 may comprise a unit 121 configured to perform hearing loss compensation, a unit 122 configured to perform noise reduction, and a unit (MMI control) 123 for controlling man-machine interfacing.

The input unit 111 is configured to generate an input signal representing sound. The input unit may comprise an input transducer, e.g., one or more microphones, for converting an input sound to the input signal. The input unit may comprise a wireless receiver for receiving a wireless signal comprising or representing sound and for providing the signal representing sound.

The output unit 112 may comprise an output transducer. The output transducer may comprise a loudspeaker (sometimes denoted a receiver) for providing an acoustic signal to the user of the hearing aid. The output unit may, additionally or alternatively, comprise a transmitter for transmitting sound picked up by the hearing aid to another device.

One or both of the input unit 111 and the noise reduction unit 122 may comprise a directional microphone system. The directional microphone system is adapted to spatially filter sounds from the surroundings of the user wearing the hearing aid, and thereby enhance a target acoustic source among a multitude of acoustic sources in the surroundings of the user. The directional system may be adapted to detect, e.g., adaptively detect, from which direction a particular part of the microphone signal originates. This can be achieved in different ways as described e.g., in the prior art. In hearing aids, a microphone array beamformer is often used for spatially attenuating background noise sources. The beamformer may comprise a linear constraint minimum variance (LCMV) beamformer. Many beamformer variants can be found in literature. The minimum variance distortionless response (MVDR) beamformer is widely used in microphone array signal processing. Ideally the MVDR beamformer keeps the signals from the target direction (also referred to as the look direction) unchanged, while attenuating sound signals from other directions maximally. The generalized sidelobe canceller (GSC) structure is an equivalent representation of the MVDR beamformer offering computational and numerical advantages over a direct implementation in its original form.

The man-machine interface unit 114 may comprise one or more hardware elements, e.g., one or more buttons, one or more accelerometers and one or more microphones, to detect user interaction.

The wireless communication unit 116 may include a short-range wireless radio e.g., including a controller in communication with the processor.

The processor may be configured with a signal processing path receiving audio data via the input unit with one or more microphones and/or via a radio unit; processing the audio data to compensate for a hearing loss; and rendering processed audio data via an output unit e.g., comprising a loudspeaker. The signal processing path may comprise one or more control paths and one or more feedback paths. The signal processing path may comprise a multitude of signal processing stages.

Figure 3:
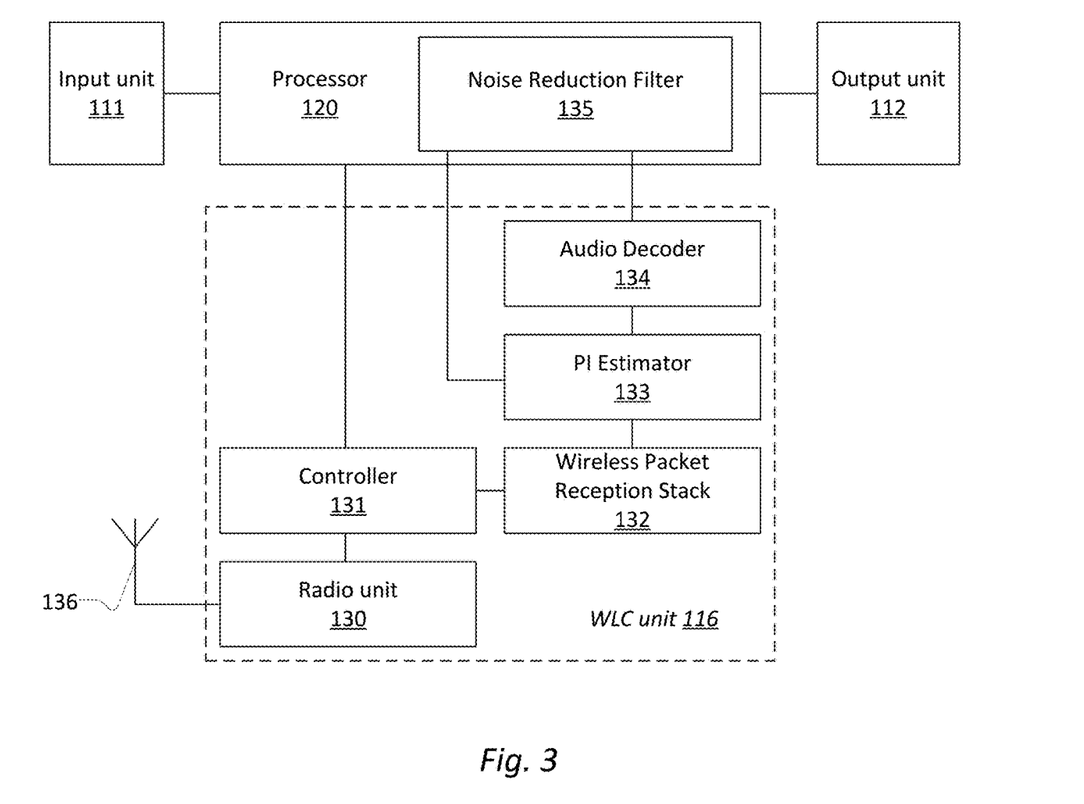
FIG. 3 shows a second block diagram of a hearing aid including a radio unit with a packet integrity estimator and an audio decoder.

FIG. 3 shows a second block diagram of a hearing aid including a wireless communication unit. The wireless communication unit 116 includes a radio unit 130 connected to an antenna 136; a controller 131 controlling wireless communication with a remote electronic device, a wireless packet reception stack 132 which provides protocol handling and buffering of audio frames, a packet integrity estimator (PI estimator) 133 which performs at least a portion of the method described herein; and an audio decoder 134, which decodes encoded audio samples and provides coded audio samples to the processor 120 e.g., to the noise reduction filter 135.

The input unit 111 provides an input signal to the processor 120, which in turn provides an output signal to the output unit 112. The processor may include a noise reduction filter 135, e.g., a transient noise reduction filter. The noise reduction filter 135 filters coded audio samples from the audio decoder 134. In some examples, the noise reduction filter 135 is controlled by the packet integrity (PI) estimator 133 e.g., by a fitness value provided by the PI estimator 133.

The processor 120 may be adapted to provide a frequency dependent gain according to a user's particular needs (e.g. in accordance with a hearing aid prescription). The processor 120 may comprise a 'forward path' providing signal processing of the input signal to provide the output signal. The processor may also comprise an 'analysis' path comprising functional components for analysing signals and/or controlling processing of the forward path. Some or all signal processing of the analysis path and/or the forward path may be conducted in the frequency domain, in which case the hearing aid comprises appropriate analysis and synthesis filter banks. Some or all signal processing of the analysis path and/or the forward path may be conducted in the time domain. An analogue electric signal representing an acoustic signal may be converted to a digital audio signal in an analogue-to-digital (AD) conversion process, where the analogue signal is sampled with a predefined sampling frequency or rate fs, fs being e.g., in the range from 8 kHz to 48 kHz.

The hearing aid may comprise an analogue-to-digital (AD) converter to digitize an analogue input (e.g., from an input transducer, such as a microphone) with a predefined sampling rate, e.g., 20 kHz. The hearing aids may comprise a digital-to-analogue (DA) converter to convert a digital signal to an analogue output signal, e.g., for being presented to a user via an output transducer.

The hearing aid, e.g., the input unit, and or the antenna and transceiver circuitry may comprise a transform unit for converting a time domain signal to a signal in the transform domain (e.g., frequency domain or Laplace domain, etc.). The transform unit may be constituted by or comprise a TF-conversion unit for providing a time-frequency representation of an input signal. The time-frequency representation may comprise an array or map of corresponding complex or real values of the signal in question in a particular time and frequency range. The TF conversion unit may comprise a filter bank for filtering a (time varying) input signal and providing a number of (time varying) output signals each comprising a distinct frequency range of the input signal. The TF conversion unit may comprise a Fourier transformation unit (e.g., a Discrete Fourier Transform (DFT) algorithm, or a Short Time Fourier Transform (STFT) algorithm, or similar) for converting a time variant input signal to a (time variant) signal in the (time-)frequency domain. The frequency range considered by the hearing aid from a minimum frequency (fmin) to a maximum frequency (fmax) may comprise a part of the typical human audible frequency range from 20 Hz to 20 kHz, e.g., a part of the range from 20 Hz to 12 kHz. Typically, a sample rate (fs) is larger than or equal to twice the maximum frequency fmax, fs≥2fmax. A signal of the forward and/or analysis path of the hearing aid may be split into a number (NI) of frequency bands (e.g., of uniform width), where NI is e.g., larger than 5, such as larger than 10, such as larger than 50, such as larger than 100, such as larger than 500, at least some of which are processed individually. The hearing aid may be adapted to process a signal of the forward and/or analysis path in a number (NP) of different frequency channels (NP NI). The frequency channels may be uniform or non-uniform in width (e.g., increasing in width with frequency), overlapping or non-overlapping.

The hearing aid may be configured to operate in different modes, e.g., a normal mode and one or more specific modes, e.g., selectable by a user, or automatically selectable. A mode of operation may be optimized to a specific acoustic situation or environment, e.g., a communication mode, such as a telephone mode. A mode of operation may include a low-power mode, where functionality of the hearing aid is reduced (e.g., to save power), e.g., to disable wireless communication, and/or to disable specific features of the hearing aid.

The hearing aid may comprise a number of detectors configured to provide status signals relating to a current physical environment of the hearing aid (e.g. the current acoustic environment), and/or to a current state of the user wearing the hearing aid, and/or to a current state or mode of operation of the hearing aid. Alternatively, or additionally, one or more detectors may form part of an external device in communication (e.g., wirelessly) with the hearing aid. An external device may e.g., comprise another hearing aid, a remote control, and audio delivery device, a telephone (e.g., a smartphone), an external sensor, etc.

One or more of the number of detectors may operate on the full band signal (time domain). One or more of the number of detectors may operate on band split signals ((time-) frequency domain), e.g., in a limited number of frequency bands.

The number of detectors may comprise a level detector for estimating a current level of a signal of the forward path. The detector may be configured to decide whether the current level of a signal of the forward path is above or below a given (L-)threshold value. The level detector operates on the full band signal (time domain). The level detector operates on band split signals ((time-) frequency domain).

The hearing aid may comprise a voice activity detector (VAD) for estimating whether (or with what probability) an input signal comprises a voice signal (at a given point in time). A voice signal may in the present context be taken to include a speech signal from a human being. It may also include other forms of utterances generated by the human speech system (e.g., singing). The voice activity detector unit may be adapted to classify a current acoustic environment of the user as a VOICE or NO-VOICE environment. This has the advantage that time segments of the electric microphone signal comprising human utterances (e.g. speech) in the user's environment can be identified, and thus separated from time segments only (or mainly) comprising other sound sources (e.g. artificially generated noise). The voice activity detector may be adapted to detect as a VOICE also the user's own voice. Alternatively, the voice activity detector may be adapted to exclude a user's own voice from the detection of a VOICE.

The hearing aid may comprise an own voice detector for estimating whether or not (or with what probability) a given input sound (e.g., a voice, e.g., speech) originates from the voice of the user of the system. A microphone system of the hearing aid may be adapted to be able to differentiate between a user's own voice and another person's voice and possibly from non-voice sounds.

The number of detectors may comprise a movement detector, e.g. an acceleration sensor. The movement detector may be configured to detect movement of the user's facial muscles and/or bones, e.g. due to speech or chewing (e.g. jaw movement) and to provide a detector signal indicative thereof.

The hearing aid may comprise a classification unit configured to classify the current situation based on input signals from (at least some of) the detectors, and possibly other inputs as well. In the present context 'a current situation' may be taken to be defined by one or more of a) the physical environment (e.g., including the current electromagnetic environment, e.g., the occurrence of electromagnetic signals (e.g. comprising audio and/or control signals) intended or not intended for reception by the hearing aid, or other properties of the current environment than acoustic);

b) the current acoustic situation (input level, feedback, etc.), and c) the current mode or state of the user (movement, temperature, cognitive load, etc.);

d) the current mode or state of the hearing aid (program selected, time elapsed since last user interaction, etc.) and/or of another device in communication with the hearing aid.

The classification unit may be based on or comprise a neural network, e.g., a trained neural network.

The hearing aid may comprise an acoustic (and/or mechanical) feedback control (e.g., suppression) or echo-cancelling system. Adaptive feedback cancellation can track feedback path changes over time. It is typically based on a linear time invariant filter to estimate the feedback path, but its filter weights are updated over time. The filter update may be calculated using stochastic gradient algorithms, including some form of the Least Mean Square (LMS) or the Normalized LMS (NLMS) algorithms. They both have the property to minimize the error signal in the mean square sense with the NLMS additionally normalizing the filter update with respect to the squared Euclidean norm of some reference signal.

Figure 4A:
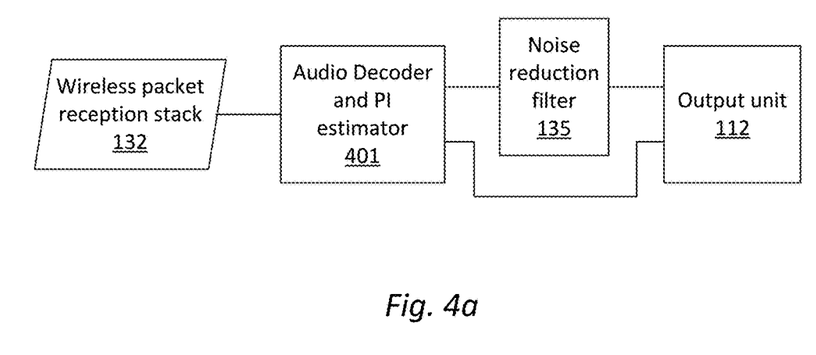
FIGS. 4*a* and 4*b* show block diagrams of a packet integrity estimator and a concealment filter.
Figure 4B:
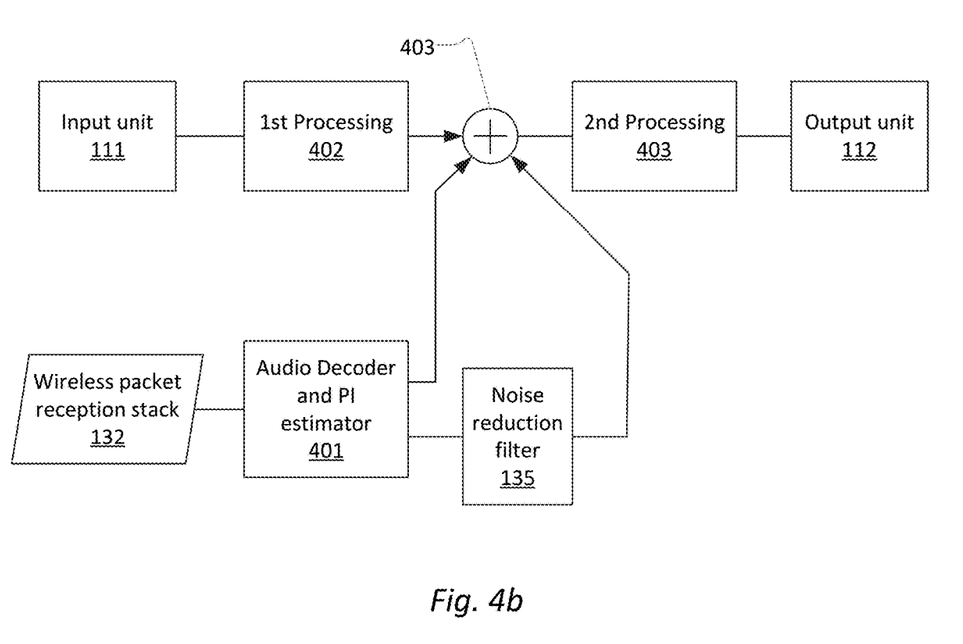

FIGS. 4a and 4b show block diagrams of a packet integrity estimator and a noise reduction filter. In the present context, the noise reduction filter conceals bit-errors at least for first audio frames with a fitness value satisfying the first criterion. The noise reduction filter may also be denoted a bit-error concealment filter.

In FIG. 4a, the wireless packet reception stack 132 is an audio buffer and delivers the first frame to the audio decoder and PI estimator 401. The audio decoder and PI estimator 401 performs the operations of the audio decoder 134 and the PI estimator 133. The audio decoder and PI estimator 401 determines to send decoded audio samples, also denoted coded audio samples, to the output unit for rendering the coded audio samples as an audio signal or alternatively, determines to send the decoded audio samples to the noise reduction filter 135 e.g., performing transient noise reduction. The determination to filter or to send to the output unit may be based on the fitness value.

Also, in FIG. 4b the wireless packet reception stack 132 is an audio buffer and delivers the first frame to the audio decoder and PI estimator 401. The audio decoder and PI estimator 401 performs the operations of the audio decoder 134 and the PI estimator 133. The audio decoder and PI estimator 401 determines to send decoded audio samples, also denoted coded audio samples, to a mixer 403 (while forgoing transient noise reduction). Alternatively, the audio decoder and PI estimator 401 determines to send decoded audio samples to the mixer 403 via the noise reduction filter 135. The determination to filter or to send to the output unit may be based on the fitness value.

The mixer 403 also receives the input signal from the input unit 111. The input signal may be processed by 1$^{st}$ processing 402 before reaching the mixer. The 1$^{st}$ processing may include one or more of temporal filtering, spatial filtering, e.g., beamforming, conversion to a short-time frequency domain, etc. An output from the mixer may comprise a linear combination of the input signal from the input unit 111, e.g., via the 1$^{st}$ processing 402 and the audio samples received from the wireless packet reception stack 132. The mixer may provide a static mixing ratio; an adjustable mixing ratio, e.g., controlled via a setting in a program in the hearing aid; or a dynamic, e.g., adaptive, mixing ratio. The mixer may comprise an adder or summing unit providing linear mixing. The mixer 403 enables mixing of speech from remote party to a telephone conversation relayed from e.g., the hearing aid user's smartphone to the hearing aid via the short-range wireless communication and an acoustic signal, captured by the input unit 111, from the surroundings of the user.

A signal from the mixer is sent to the output unit 112 for rendering as an audio signal e.g., via 2$^{nd}$ processing 403. The 2$^{nd}$ processing 403 may include one or more of compensation for a hearing loss, e.g., a prescribed hearing loss, and conversion from a short-time frequency domain to a time-domain representation.

Figure 5:
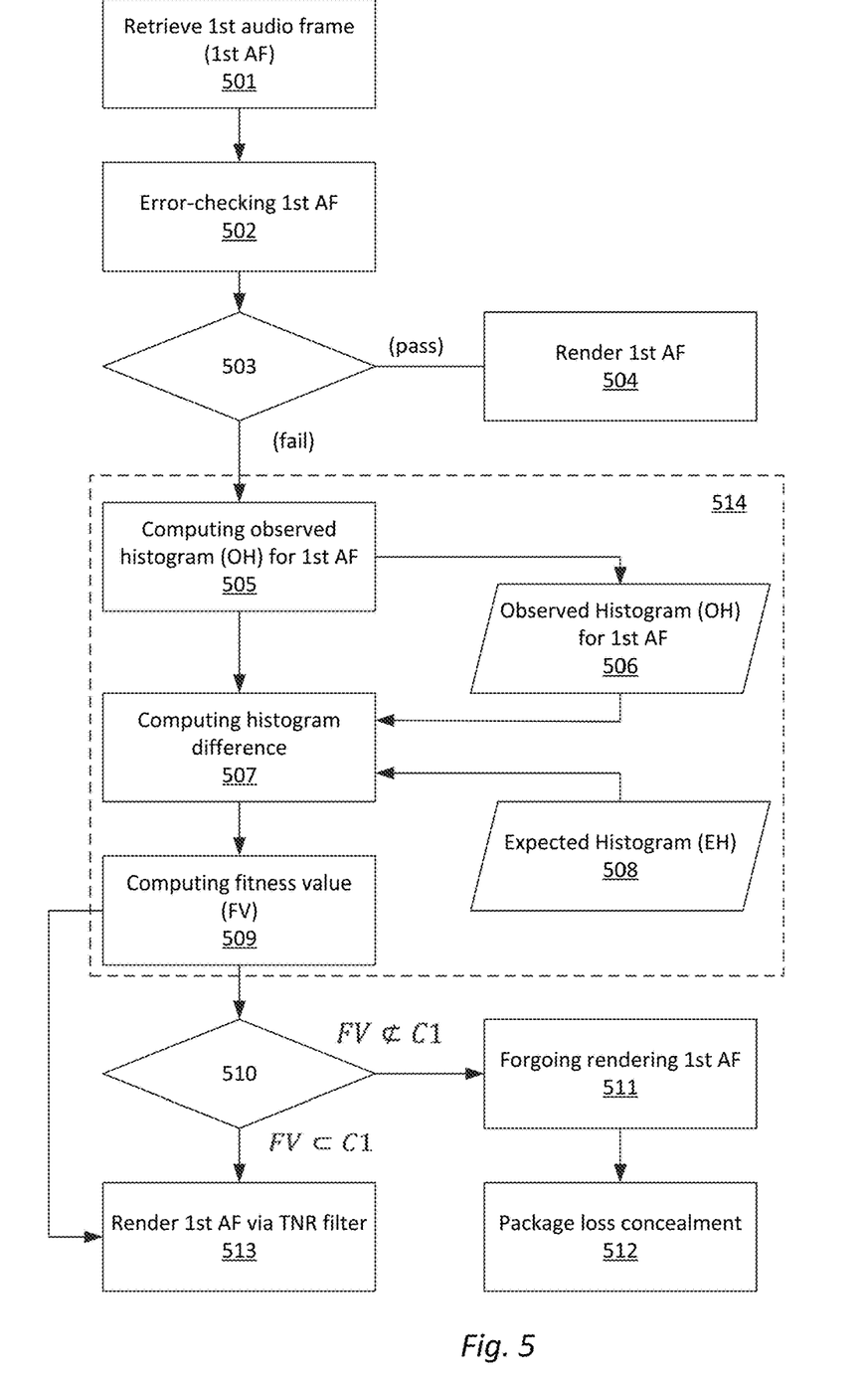
FIG. 5 shows a flowchart for the method.

FIG. 5 shows a flowchart for the method. At step 501 the hearing aid retrieves a first audio frame (1$^{st}$ AF) e.g., from the wireless packet reception stack 132. At step 502 error-checking is performed on the first audio frame e.g., based on a cyclic redundancy check. If the check results in detection of no errors (pass), step 503 branches the method off to render the first audio frame as an audio signal at step 504. If, on the contrary, the check results in detection of one or more errors (fail), step 503 branches the method off to perform a test 504.

At step 505 the hearing aid performs computing an observed histogram (OH) for the first audio frame. The observed histogram may be a one-dimensional histogram that is computed by counting the number of encoded sample values in categories of encoded sample values. E.g., if the encoded sample value 56 occurs five times in the audio frame and the encoded sample value 78 occurs 0 times, the table may comprise a row such as [56; 5] and a row such as [78; 0]. The table may comprise one row for each possible sample value.

Alternatively, the observed histogram may be a two-dimensional histogram that is computed by counting the number of encoded sample values in categories of encoded sample values, wherein the categories are defined by a sequence of a sample value (time index N) and an immediately preceding sample value (time index N−1). E.g., if a sequence comprises an encoded sample value 56 preceded by the sample value 84 and that sequence occurs two times, the table may comprise a row such as [84; 56; 2]. Many other examples are possible. A person skilled in the art will know how to compute a histogram based on sample values in a data frame and how to compute a histogram based a sequence of sample values in a data frame. The histogram based on sequences corresponds to estimating a conditional probability. The observed histogram (OH) for the first audio frame 506 is stored in a memory e.g., memory 115.

At some time prior to receiving the first data frame, an expected histogram (EH) 508 is stored in a memory e.g., memory 115. The expected histogram (EH) may resemble a histogram of values output from an encoder in accordance with the codec e.g., when the encoder encodes an audio signal containing tones, music, speech, white noise, coloured noise, or a combination thereof. The expected histogram values may approximate a codec output distribution. The expected histogram values may be obtained by performing simulations based on obtaining a histogram of second samples, wherein an amount of second samples is e.g., much larger than the number of samples in the first frame.

At step 507 the hearing aid performs computing a histogram difference based on the observed histogram (OH) 506 and the expected histogram (EH) 508. The difference may be an accumulated difference at each of the categories. Preferably, the observed histogram (OH) 506 and the expected histogram (EH) 508 are organised to comprise the same categories for ease of computations. The difference may be based on a 1-norm difference or a 2-norm difference (sometimes denoted a divergence). Other types of differences are possible.

At step 509 the hearing aid performs computing a fitness value (FV). The fitness value may be a probability value, e.g., a so-called P-value, associated with a determined probability density distribution of the difference e.g. a chi-squared distribution. However, in a simple case, the fitness value (FV) is equal to the difference computed in step 509.

At step 510 the hearing aid determines whether a first criterion (C1) is fulfilled. The first criterion may be a threshold value e.g., a confidence value associated with the determined probability density distribution of the difference.

In accordance with a determination that the first criterion (C1) is fulfilled (FV c C1), the method proceeds to step 513 to render the first audio frame via a noise reduction filter, e.g., a transient noise reduction (TNR) filter.

On the contrary, in accordance with a determination that the first criterion (C1) is not fulfilled (FV∉C1), the method proceeds to step 512 to perform packet loss concealment as known in the art without rendering the first audio frame as an audio signal i.e., as set out in box 511 forgoing rendering the 1$^{st}$ audio frame. Thus, the first audio frame as such is not rendered, but rather—in accordance with packet loss concealment—a replacement for the first audio frame is rendered.

Other embodiments of the method are possible. E.g., based on using the fitness value for controlling noise reduction at least for one or more ranges of the fitness value.

Figure 6A:
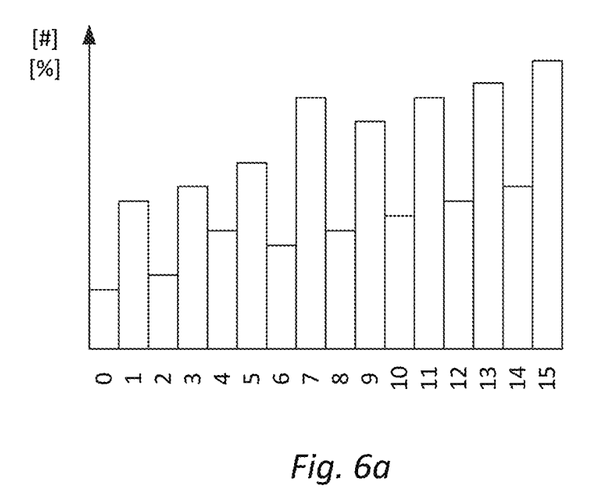
FIGS. 6*a* and 6*b* illustrate expected histograms.

FIGS. 6a and 6b illustrate expected histograms. FIG. 6a illustrates an expected histogram for encoded audio sample values. The histogram is, for illustration only, shown to comprise 16 categories of encoded audio sample values. The expected count (#) or probability (%) at each category is shown by bars. The illustration is not accurate but may resemble a rough approximation of an expected distribution.

Figure 6B:
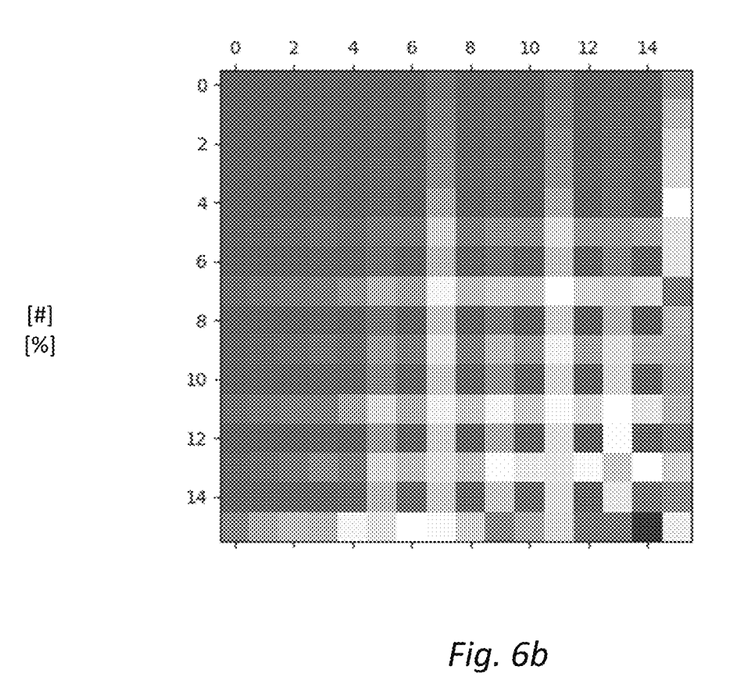

FIG. 6b illustrates an expected histogram for a sequence of encoded audio sample values (corresponding to a conditional probability or count). The sequence comprises an encoded audio sample value (time index N) and an immediately preceding encoded audio sample value (time index N−1). The probability (%) or count (#) is shown in a heatmap depiction wherein brighter tones generally represent higher probabilities or counts compared to darker tones, which generally represent lower probabilities or counts.

Figure 7:
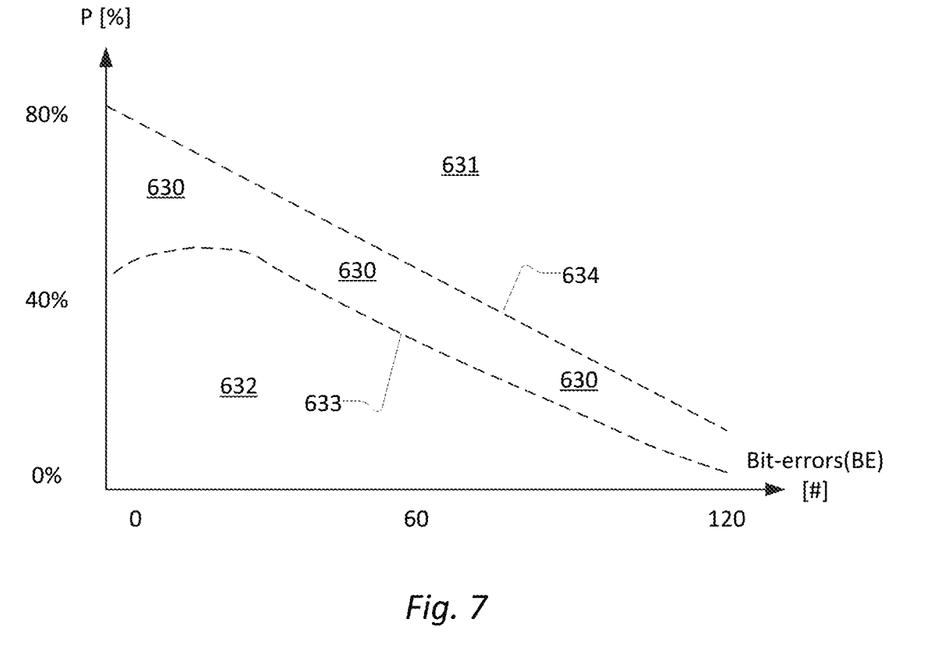
FIG. 7 illustrates uncertainty related to the test.

Other examples than the histograms illustrated in FIGS. 6a and 6b are possible. FIG. 7 illustrates uncertainty related to the test. Dashed curves 633 and 634 roughly defines a band 630 of data points obtained by simulation. During the simulation various degrees, BE 0-120, of bit-errors (BE) are induced in audio frames containing 120 encoded audio samples. Each data point represents a pair of a BE value and the correspondingly determined fitness value in the form of a P-value represented in percentages (%). The band 630 comprises a denser distribution of data points compared to the areas 631 and 632, outside the band 630. It can be seen from the figure that the test according to the method can provide a conservative (safe) policy e.g., in the sense that the fitness value at or above about 60% results in less than about 35-40 BEs.

In the present context, a hearing aid, e.g., a hearing instrument, refers to a device, which is adapted to improve, augment and/or protect the hearing capability of a user by receiving acoustic signals from the user's surroundings, generating corresponding audio signals, possibly modifying the audio signals, and providing the possibly modified audio signals as audible signals to at least one of the user's ears. Such audible signals may e.g., be provided in the form of acoustic signals radiated into the user's outer ears, acoustic signals transferred as mechanical vibrations to the user's inner ears through the bone structure of the user's head and/or through parts of the middle ear as well as electric signals transferred directly or indirectly to the cochlear nerve of the user.

The hearing aid may be configured to be worn in any known way, e.g. as a unit arranged behind the ear with a tube leading radiated acoustic signals into the ear canal or with an output transducer, e.g. a loudspeaker, arranged close to or in the ear canal, as a unit entirely or partly arranged in the pinna and/or in the ear canal, as a unit, e.g. a vibrator, attached to a fixture implanted into the skull bone, as an attachable, or entirely or partly implanted, unit, etc. The hearing aid may comprise a single unit or several units communicating (e.g., acoustically, electrically or optically) with each other. The loudspeaker may be arranged in a housing together with other components of the hearing aid or may be an external unit in itself (possibly in combination with a flexible guiding element, e.g., a dome-like element).

A hearing aid may be adapted to a particular user's needs, e.g., a hearing impairment. A configurable signal processing circuit of the hearing aid may be adapted to apply a frequency and level dependent compressive amplification of an input signal. A customized frequency and level dependent gain (amplification or compression) may be determined in a fitting process by a fitting system based on a user's hearing data, e.g., an audiogram, using a fitting rationale (e.g. adapted to speech). The frequency and level dependent gain may e.g., be embodied in processing parameters, e.g., uploaded to the hearing aid via an interface to a programming device (fitting system), and used by a processing algorithm executed by the configurable signal processing circuit of the hearing aid.

A 'hearing system' refers to a system comprising one or two hearing aids, and a 'binaural hearing system' refers to a system comprising two hearing aids and being adapted to cooperatively provide audible signals to both of the user's ears. Hearing systems or binaural hearing systems may further comprise one or more 'auxiliary devices', which communicate with the hearing aid(s) and affect and/or benefit from the function of the hearing aid(s). Such auxiliary devices may include at least one of a remote control, a remote microphone, an audio gateway device, an entertainment device, e.g., a music player, a wireless communication device, e.g., a mobile phone (such as a smartphone) or a tablet or another device, e.g. comprising a graphical interface. Hearing aids, hearing systems or binaural hearing systems may e.g., be used for compensating for a hearing-impaired person's loss of hearing capability, augmenting, or protecting a normal-hearing person's hearing capability and/ or conveying electronic audio signals to a person. Hearing aids or hearing systems may e.g., form part of or interact with public-address systems, active ear protection systems, handsfree telephone systems, car audio systems, entertainment (e.g., TV, music playing or karaoke) systems, teleconferencing systems, classroom amplification systems, etc.

There is also provided a hearing aid according to the below items:

Items

1. A hearing aid, comprising:
   one or more processors; a memory; an output unit; and a wireless communication unit; wherein the hearing aid is configured to:
   receiving, via the wireless communication unit, a wireless signal including a succession of frames including a first frame including first encoded audio samples; and determining a first codec;
   performing an error check based on the first frame; and in accordance with a determination that the first frame fails to pass the error check:
   performing a test, including determining first difference values between first expected histogram values in categories and first observed histogram values of the first encoded audio samples in the categories; wherein the expected histogram values are associated with the first codec; and determining a first fitness value associated with the first difference values; wherein the first expected histogram values are stored in the memory;
   in accordance with a determination that the first fitness value satisfies a first criterion, enabling rendering of the first encoded audio samples via the output unit.
2. A hearing aid according to item 1, further configured to:
   in accordance with a determination that the first frame passes the error check:
   forgoing performing the test based on the first frame, and
   enabling rendering the first encoded audio samples via the output unit.
3. A hearing aid according to any of the preceding items, further configured to:
   in accordance with a determination that the first fitness value fails to satisfy the first criterion, or in accordance with a determination that the first fitness value satisfies a second criterion, different from the first criterion:
   forgoing enabling rendering the first encoded audio samples via the output unit.
4. A hearing aid according to any of the preceding items, further configured to:
   in accordance with a determination that the first fitness value fails to satisfy the first criterion, or in accordance with a determination that the first fitness value satisfies a second criterion, different from the first criterion:
   forgoing enabling rendering the first encoded audio samples via the output unit; and
   performing packet loss concealment.
5. A hearing aid according to any of the preceding items, further configured to:
   determining the first codec from a set of codecs by codec negotiation between the wireless communication unit and a remote electronic device in communication with wireless communication unit; and retrieving the first expected histogram values from a memory; wherein the first expected histogram values are associated with the first codec.

6. A hearing aid according to any of the preceding items, further configured to:
in accordance with a determination that the first fitness value satisfies the first criterion:
decoding, in accordance with the first codec, the first encoded audio samples into coded audio samples.

7. A hearing aid according to any of the preceding items, further configured to:
in accordance with a determination that the first fitness value satisfies the first criterion:
performing first noise reduction on the coded audio samples.

8. A hearing aid according to any of the preceding items, further configured to:
selecting a first processing option among a set of processing options based on the first fitness value; wherein the set of processing options includes at least the first processing option and a second processing option;
wherein the first processing option includes performing first noise reduction on the first audio frame.

9. A hearing aid according to item 8, wherein the set of processing options includes a third processing option; and wherein the third processing option includes performing third noise reduction on the first audio frame; wherein the third noise reduction is different from the first noise reduction.

10. A hearing aid according to any of the preceding items, wherein the test is a statistical test, wherein the first fitness value is a probability value; and wherein the first criterion is a confidence interval; further configured to:
determining whether the first fitness value is significant or not significant.

11. A hearing aid according to any of the preceding items, wherein the expected histogram values are obtained from a histogram of a second number of encoded samples without errors; wherein a first number of encoded samples is the number of samples in the first frame; and wherein the second number of encoded samples is significantly greater than the first number of encoded samples.

12. A hearing aid according to any of the preceding items, wherein the codec is associated with linear encoding/decoding, comprising:
receiving a second frame, comprised by a first succession of frames, associated with a retransmission of the first frame;
splitting the first frame into a first subframe and a second subframe;
splitting the second frame into a third subframe and a fourth subframe;
determining the first fitness value for the first subframe and determining a second fitness value for the second subframe;
determining the third fitness value for the third subframe and determining a fourth fitness value for the fourth subframe;
recomposing the first frame from two or more of the first subframe; the second subframe, the third subframe and the fourth subframe based on the first fitness value, the second fitness value, the third fitness value and the fourth fitness value.

13. A hearing aid according to any of the preceding items, further configured to:
performing compensation for a prescribed hearing loss based on the first encoded audio samples and one or more hearing loss parameter values before rendering the first encoded audio samples as an audio signal via the output unit; and
reproducing the first frame as an audio signal via the output unit.

14. A hearing aid according to any of the preceding items, wherein the hearing aid comprises an input unit and is configured to:
in accordance with a determination that the first fitness value satisfies the first criterion or a second criterion:
decoding, in accordance with the first codec, the first encoded audio samples into first coded audio samples;
receiving, via the input unit, an input signal; wherein the input signal comprises third coded audio samples;
generating an output signal based on processing the first coded audio samples and the second coded audio samples; wherein the output signal comprises third coded audio samples;
rendering the third coded audio samples via the output unit 15. A binaural hearing aid system, comprising a first hearing aid as set out in any of the preceding items and a second hearing aid as set out in any of the preceding items; wherein each hearing aid performs an error check and a test separately from the other hearing aid.

The invention claimed is:

1. A method, comprising:
at a hearing aid with one or more processors; a memory; an output unit; and a wireless communication unit:
receiving, via the wireless communication unit, a wireless signal including a succession of frames including a first frame including first encoded audio samples; and determining a first codec;
performing an error check based on the first frame; and in accordance with a determination that the first frame fails to pass the error check:
performing a test, including determining first difference values between first expected histogram values in categories and first observed histogram values of the first encoded audio samples in the categories; wherein the expected histogram values are associated with the first codec; and determining a first fitness value associated with the first difference values; wherein the first expected histogram values are stored in the memory;
in accordance with a determination that the first fitness value satisfies a first criterion, enabling rendering of the first encoded audio samples via the output unit.

2. A method according to claim 1, comprising:
in accordance with a determination that the first frame passes the error check:
forgoing performing the test based on the first frame, and
enabling rendering the first encoded audio samples via the output unit.

3. A method according to claim 1, comprising:
in accordance with a determination that the first fitness value fails to satisfy the first criterion, or in accordance with a determination that the first fitness value satisfies a second criterion, different from the first criterion:
forgoing enabling rendering the first encoded audio samples via the output unit.

4. A method according to claim 1, comprising:
in accordance with a determination that the first fitness value fails to satisfy the first criterion, or in accordance with a determination that the first fitness value satisfies a second criterion, different from the first criterion:
forgoing enabling rendering the first encoded audio samples via the output unit; and
performing packet loss concealment.

5. A method according to claim 1, comprising:
determining the first codec from a set of codecs by codec negotiation between the wireless communication unit and a remote electronic device in communication with wireless communication unit; and
retrieving the first expected histogram values from a memory; wherein the first expected histogram values are associated with the first codec.

6. A method according to claim 1, comprising:
in accordance with a determination that the first fitness value satisfies the first criterion or a second criterion:
decoding, in accordance with the first codec, the first encoded audio samples into coded audio samples.

7. A method according to claim 1, comprising:
in accordance with a determination that the first fitness value satisfies the first criterion:
performing first noise reduction on the coded audio samples.

8. A method according to claim 1, comprising:
selecting a first processing option among a set of processing options based on the first fitness value; wherein the set of processing options includes at least the first processing option and a second processing option;
wherein the first processing option includes performing first noise reduction on the first audio frame.

9. A method according to claim 8, wherein the set of processing options includes a third processing option; and wherein the third processing option includes performing third noise reduction on the first audio frame; wherein the third noise reduction is different from the first noise reduction.

10. A method according to claim 1, wherein the test is a statistical test based on a first probability density, wherein the first fitness value is a probability value; and wherein the first criterion is a confidence interval; comprising:
determining whether the first fitness value is significant or not significant.

11. A method according to claim 1, wherein the expected histogram values are obtained from a histogram of a second number of encoded samples without errors; wherein a first number of encoded samples is the number of samples in the first frame; and wherein the second number of encoded samples is significantly greater than the first number of encoded samples.

12. A method according to claim 1, wherein the codec is associated with linear encoding/decoding, comprising:
receiving a second frame, comprised by a first succession of frames, associated with a retransmission of the first frame;
splitting the first frame into a first subframe and a second subframe;
splitting the second frame into a third subframe and a fourth subframe;
determining the first fitness value for the first subframe and determining a second fitness value for the second subframe;
determining the third fitness value for the third subframe and determining a fourth fitness value for the fourth subframe;
recomposing the first frame from two or more of the first subframe; the second subframe, the third subframe and the fourth subframe based on the first fitness value, the second fitness value, the third fitness value and the fourth fitness value.

13. A method according to claim 6, comprising:
performing compensation for a prescribed hearing loss based on the first encoded audio samples and one or more hearing loss parameter values before rendering the first encoded audio samples as an audio signal via the output unit; and
rendering the first encoded audio samples as an audio signal via the output unit.

14. A method according to claim 1, wherein the hearing aid comprises an input unit; comprising:
in accordance with a determination that the first fitness value satisfies the first criterion or a second criterion:
decoding, in accordance with the first codec, the first encoded audio samples into first coded audio samples;
receiving, via the input unit, an input signal; wherein the input signal comprises third coded audio samples;
generating an output signal based on processing the first coded audio samples and the second coded audio samples; wherein the output signal comprises third coded audio samples;
rendering the third coded audio samples via the output unit.

15. A computer-readable storage medium comprising one or more programs for execution by one or more processors of an electronic device with a display and a sensor, the one or more programs including instructions for performing the method of claim 1.

16. A hearing aid comprising:
one or more processors; a wireless receiver; one or more microphones; an output unit; and
a memory storing one or more programs, the one or more programs including instructions which, when executed by the one or more processors, cause the electronic device to perform the method of claim 1.

17. A binaural hearing aid system, comprising a first hearing aid as set out in claim 16 and a second hearing aid as set out in claim 16; wherein each hearing aid performs an error check and a test separately from the other hearing aid.

* * * * *